United States Patent
Hussain (10) Patent No.: US 7,494,887 B1
(45) Date of Patent: Feb. 24, 2009

(54) METHOD AND APPARATUS FOR FABRICATING HETEROJUNCTION BIPOLAR TRANSISTORS WITH SIMULTANEOUS LOW BASE RESISTANCE AND SHORT BASE TRANSIT TIME

(75) Inventor: Tahir Hussain, Calabasas, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 10/920,708

(22) Filed: Aug. 17, 2004

(51) Int. Cl.
*H01L 21/331* (2006.01)
*H01L 21/20* (2006.01)

(52) U.S. Cl. .................. 438/309; 438/337; 438/364; 438/478

(58) Field of Classification Search ......... 257/197–198, 257/565–593; 438/360, 320–321, 309, 335, 438/337, 339, 341, 364–366, 478, 492–509
See application file for complete search history.

(56) References Cited

U.S. PATENT DOCUMENTS

| | | | | |
|---|---|---|---|---|
| 4,728,624 A * | 3/1988 | Silvestri et al. | ............ | 438/322 |
| 4,746,626 A * | 5/1988 | Eda et al. | ............ | 438/315 |
| 4,789,643 A * | 12/1988 | Kajikawa | ............ | 438/320 |
| 4,857,479 A * | 8/1989 | McLaughlin et al. | ............ | 438/348 |
| 4,896,203 A * | 1/1990 | Kajikawa | ............ | 257/197 |
| 4,897,704 A * | 1/1990 | Sakurai | ............ | 257/588 |
| 4,920,401 A * | 4/1990 | Sakai et al. | ............ | 257/588 |
| 5,111,265 A * | 5/1992 | Tanaka | ............ | 257/25 |
| 5,258,642 A * | 11/1993 | Nakamura | ............ | 257/514 |
| 5,286,997 A * | 2/1994 | Hill | ............ | 257/586 |
| 5,389,562 A * | 2/1995 | Mohammad | ............ | 704/243 |
| 5,656,514 A * | 8/1997 | Ahlgren et al. | ............ | 438/320 |
| 5,656,515 A * | 8/1997 | Chandrasekhar et al. | ..... | 438/319 |
| 6,232,649 B1 * | 5/2001 | Lee | ............ | 257/588 |
| 6,319,786 B1 * | 11/2001 | Gris | ............ | 438/341 |
| 6,410,404 B1 * | 6/2002 | Zambrano | ............ | 438/429 |
| 6,897,545 B2 * | 5/2005 | Menut et al. | ............ | 257/575 |
| 6,972,237 B2 * | 12/2005 | Verma et al. | ............ | 438/312 |
| 2003/0045066 A1 * | 3/2003 | Igarashi | ............ | 438/350 |
| 2005/0017325 A1 * | 1/2005 | Gris | ............ | 257/552 |

OTHER PUBLICATIONS

W. Liu, et al., "Laterally etched undercut (LEU) technique to reduce base-collector capacitance in heterojunction bipolar transistors," IEEE GaAs IC Symposium, 1995, pp. 167-170.
M. Rodwell, et al., "Submicron scling of HBT's," IEEE Trans. Elect. Dev., vol. 48, No. 11, pp. 2406-2624.

* cited by examiner

*Primary Examiner*—Douglas M Menz
*Assistant Examiner*—Matthew W Such
(74) *Attorney, Agent, or Firm*—Tope-McKay & Associates (57) ABSTRACT

A method for fabricating heterojunction bipolar transistors that exhibit simultaneous low base resistance and short base transit times, which translate into semiconductor devices with low power consumption and fast switching times, is presented. The method comprises acts for fabricating a set of extrinsic layers by depositing a highly-doped p+ layer on a substrate, depositing a masking layer on highly-doped p+ layer, patterning the masking layer with a masking opening, removing a portion of the highly-doped p+ layer and the substrate through the masking opening in the masking layer to form a well, and growing an intrinsic layered device in the well by a combination of insitu etching and epitaxial regrowth, where an intrinsic layer has a thickness selected independently from a thickness of its corresponding extrinsic layer, thus allowing the resulting device to have thick extrinsic base layer (low base resistance) and thin intrinsic base layer (short base transit times) simultaneously.

20 Claims, 6 Drawing Sheets

Plan view

METHOD AND APPARATUS FOR FABRICATING HETEROJUNCTION BIPOLAR TRANSISTORS WITH SIMULTANEOUS LOW BASE RESISTANCE AND SHORT BASE TRANSIT TIME

BACKGROUND (1) Technical Field

The present invention relates to the fields of Very Large Scale Integration (VLSI) circuit design, electronic devices, and microelectronic circuits. More specifically, the present invention pertains to a method and apparatus for fabricating heterojunction bipolar transistors that exhibit simultaneous low base resistance and short base transit times, which translate into semiconductor devices with low power consumption and fast switching times.

(2) Description of Related Art

The trend in the VLSI design industry is to provide the consumer with VLSI chips and semiconductor devices that perform faster, that have smaller dimensions, and that consume less power than the prior VLSI chips and semiconductor devices in the market. One example of this trend is in the area of personal computers, where every user desires their personal computer to be faster and smaller. Unfortunately, the faster a VLSI chip performs, the more power the chip absorbs, causing it to overheat which, in turn, requires that the VLSI chips be placed farther away from one another on circuit boards, and in the particular case of a personal computer, forces the system to include bulky air cooling fans. Thus, in microelectronic applications, power absorption and the need for faster performance are the two primary issues that constrain the fabrication and design of a semiconductor device.

In order to speed up the switching time for a Heterojunction Bipolar Transistor (HBT) device, the thickness of the intrinsic base layer of the HBT device must be vertically scaled down. In contrast, the thickness of the extrinsic base layer is inversely proportional to the resistance of the contacts to the base layer in the extrinsic device. Therefore, in order to decrease the power absorbed by the HBT device, an artisan must decrease the resistance of the contacts to the base layer in the extrinsic device by vertically scaling up the thickness of the extrinsic base layer. Since state of the art VLSI design techniques cannot decouple the thickness of the extrinsic base from the thickness of the base layer in the intrinsic device, vertically scaling down the base layer to improve the speed of the HBT device increases the base resistance in the extrinsic base layer, thus increasing the power being absorbed and negating some of the benefits of the reduced device scaling. Therefore, the artisans are faced with the problem of trying to simultaneously satisfy two opposing goals, since vertical and lateral scaling of HBT devices is needed to make faster HBT devices and circuits.

In recent years, methods to obtain a thicker highly-doped p+ base layer in the extrinsic region have relied on re-growing on a partially fabricated mesa. In this technique, a mask is used to pattern the emitter mesa. Subsequently, with the highly-doped p+ base layer being the exposed layer, another layer of a p-type semiconductor is grown on top of the exposed highly-doped p+ base layer. Then the mask is removed, and the processing of the HBT is completed. However, the layers grown using this technique are of poor quality and the method does not solve the problem of the resistance of the contacts to the base layer in the extrinsic device and the extrinsic base-collector capacitance in the extrinsic device.

Moreover, there have been multiple approaches to minimize the base-collector capacitance reported in the literature. In one approach, the collector layer underneath the base contacts is etched away using a technique that selectively etches the collector layer leaving the base layer untouched, as discussed in "Laterally Etched Undercut (LEU) Technique to Reduce Base-collector Capacitance in Heterojunction Bipolar Transistors," *IEEE GaAs IC Symposium*, 1995, pp. 167-170, by W. Liu et al. In another approach, known as the "transferred substrate method," the substrate is removed from the active intrinsic device. Then the collector layer is patterned so as to remove it from the extrinsic regions of the device, and then the device is attached to a host substrate, as discussed in "Submicron scaling of HBTs," *IEEE Trans. on Electronic Devices*, vol. 48, no. 11, pp. 2406-2624, by M. Rodwell et al. However, both of these techniques, while good for demonstrating the high potential of such device, are not consistent with the high yields required to make complex (>10,000 transistor) integrated circuits.

Therefore, it would be desirable to provide a method for fabricating heterojunction bipolar transistors that exhibit simultaneous low base resistance and short base transit times, which translate into semiconductor devices with low power consumption and fast switching times. Such a method would allow a VLSI designer to select the thickness of an intrinsic layer independently from a thickness of its corresponding extrinsic layer, thus allowing the resulting device to have a thick extrinsic base layer (low base resistance) and a thin intrinsic base layer (short base transit times) simultaneously. Furthermore, it is desirable that the method for fabricating HBT devices has a consistent high yield of non-defective HBT devices, which are required to make accurate, complex (>10,000 transistor) integrated circuits.

For the foregoing reasons, there is a great need for a technique that fabricates heterojunction bipolar transistors that exhibit simultaneous low base resistance and short base transit times, which translate into semiconductor devices with low power consumption and fast switching times.

The following references are presented for further background information:

[1] W. Liu et al, "Laterally Etched Undercut (LEU) Technique to Reduce Base-collector capacitance in Heterojunction Bipolar Transistors," *IEEE GaAs IC Symposium,* 1995, pp. 167-170.

[2] M. Rodwell et al, "Submicron scaling of HBTs," *IEEE Trans. on Electronic Devices*, vol. 48, no. 11, pp. 2406-2624.

SUMMARY

The present invention provides a method for fabricating semiconductor devices. In the method, an act of depositing a set of extrinsic layers on a substrate is performed, followed by an act of removing a portion of the extrinsic layers and substrate to create a well having an intrinsic portion and an extrinsic portion, where the intrinsic portion is configured for receiving a layered intrinsic semiconductor device. Subsequently, an act is performed, forming a layered intrinsic semiconductor device in the intrinsic portion of the well, where a layer of the intrinsic semiconductor device corresponds to a layer of the extrinsic layers.

In another aspect, in the act of depositing a set of extrinsic layers, a highly-doped p+ extrinsic layer is deposited, and where in the act of removing a portion of the extrinsic layers, a portion of the highly-doped p+ extrinsic layer and a portion of the substrate are removed.

In still another aspect, in the act of removing a portion of the highly-doped p+ extrinsic layer and a portion of the substrate, the well is formed as a recess having an extrinsic portion corresponding to the extrinsic portion of the well and an intrinsic portion corresponding to the intrinsic portion of the well, where the intrinsic portion of the recess is defined as proximate to an intersection between the highly-doped p+ extrinsic layer and the recess and where the extrinsic portion of the recess is defined as outside the intersection between the highly-doped p+ extrinsic layer and the recess, and wherein in the act of forming a layered intrinsic semiconductor device, the layered intrinsic semiconductor device is formed substantially in the intrinsic portion of the recess.

In yet another aspect, the method further comprises an act of forming a sub-collector layer in the recess, the sub-collector having an intrinsic portion proximate to the intrinsic portion of the recess and an extrinsic portion proximate to the extrinsic portion of the recess.

In a further aspect, the method further comprises an act of forming a layered intrinsic semiconductor device in the well including various acts. The formation of the intrinsic semiconductor device begins with the deposition of a collector layer on the sub-collector layer, at least a portion of which is an intrinsic portion, and where the intrinsic portion of the collector layer is proximate to the intrinsic portion of the sub-collector layer. After the deposition of the collector layer, an act is performed for depositing a base layer on the collector layer, at least a portion of which is an intrinsic portion, and where the intrinsic portion of the base layer proximate to the intrinsic portion of the collector layer; with the intrinsic portion of the base layer proximate to the highly-doped p+ extrinsic layer, where the highly-doped p+ extrinsic layer acts as an extrinsic base layer and where the intrinsic base layer has a thickness independently selectable from a thickness of the extrinsic base layer. Finally, an act is performed for depositing an emitter layer on the intrinsic base layer.

In a still further aspect, prior to the act of removing a portion of the highly-doped p+ extrinsic layer and a portion of the substrate, the method further comprises an act of masking the highly-doped p+ layer with a mask so that an area corresponding to the well is exposed in preparation for the act of removing a portion of the highly-doped p+ extrinsic layer and a portion of the substrate, where an opening in the mask corresponds to a placement of the well.

In a yet further aspect, the act of masking the highly-doped p+ layer further comprises an act of forming alignment markers to aid in accurate masking of the highly-doped p+ layer.

In another aspect, the method further comprises an act of forming ohmic contacts on the extrinsic portion of the sub-collector layer.

In still another aspect, the method further comprises an act of removing the mask.

In yet another aspect, the method further comprises an act of removing a portion of the collector layer and a portion of the base layer such that only the intrinsic portion of the collector layer and the intrinsic portion of the base layer remain.

In a further aspect, the method further comprises an act of providing a substrate formed of a semi-insulating material.

In a still further aspect, the substrate is formed of a material selected from a group consisting of InP, GaAs, and InAs.

In yet another aspect, the highly-doped p+ layer is formed of a material selected from a group consisting of InGaAs and GaAsSb.

In still another aspect, the mask is formed of a material selected from a group consisting of SiN and SiO.

In another aspect, the act of removing a portion of the extrinsic layers is performed by insitu etching.

In yet another aspect, the act of removing a portion of the extrinsic layers is performed in an epitaxial chamber.

In a further aspect, a precursor is used for the insitu etching, with the precursor selected from a group consisting of HCl, methylchloride, $BCl_3$, and $CCl_4$.

In a yet further aspect, in the act of forming a layered intrinsic semiconductor device in the well, the layered intrinsic semiconductor device is grown in an epitaxial chamber.

In a still further aspect, in the act of forming a layered intrinsic semiconductor device in the well, the epitaxial chamber is selected from a group consisting of a MOCVD machine and a MBE machine.

In another aspect, in the act of forming the sub-collector layer, the sub-collector layer is formed of n+ doped InP. Also, in the act of depositing an intrinsic collector layer, the intrinsic collector layer is formed of InP doped in a range from about 1 E16 $cm^{-3}$ to about 4 E16 $cm^{-3}$ having a thickness from about 150 nm to about 300 nm. Further, in the act of depositing the intrinsic base layer, the intrinsic base layer is formed of a p+ doped material, doped in a range from about 1 E19 $cm^{-3}$ to about 2 E20 $cm^{-3}$ having a thickness from about 15 nm to about 30 nm. Finally, in the act of depositing the emitter layer, the emitter layer is formed of a material selected from a group consisting of InP and InAlAs doped in a range from about 1 E17 $cm^{-3}$ to about 1 E18 $cm^{-3}$ having a thickness from about 50 nm to about 150 nm.

In a further aspect, the method comprises act of depositing an intrinsic etch stop layer of InGaAs having a thickness from about 1 nm to about 10 nm, wherein the intrinsic etch stop layer is formed between the intrinsic collector layer and the sub-collector layer.

The features of the above embodiments may be combined in many ways to produce a great variety of specific embodiments, as will be appreciated by those skilled in the art.

BRIEF DESCRIPTION OF THE DRAWINGS

The objects, features, aspects, and advantages of the present invention will become better understood from the following detailed descriptions of the preferred embodiment of the invention in conjunction with reference to the appended claims, and accompanying drawings where:

DETAILED DESCRIPTION

The present invention relates to the fields of Very Large Scale Integration (VLSI) circuit design and fabrication of semiconductor devices. More specifically, the present invention pertains to a method and apparatus for fabricating heterojunction bipolar transistors (HBTs) that exhibit simultaneous low base resistance and short base transit times, which translate into semiconductor devices with fast switching times and low power consumption. The following description, taken in conjunction with the referenced drawings, is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein. Furthermore it should be noted that, unless explicitly stated otherwise, the figures included herein are illustrated diagrammatically and without any specific scale, as they are provided as qualitative illustrations of the concept of the present invention.

In order to provide a working frame of reference, first a glossary of some of the terms used in the description and claims is given as a central resource for the reader. The glossary is intended to provide the reader with a general understanding of various terms as they are used in this disclosure, and is not intended to limit the scope of these terms. Rather, the scope of the terms is intended to be construed with reference to this disclosure as a whole and with respect to the claims below. Next, a brief overview is provided to give a conceptual understanding of the invention prior to developing the specific details. Subsequently, a discussion of the elements is provided in order to enable the reader to make and use the various embodiments of the invention without involving undue experimentation. Finally, a brief description of several of the key advantages of the invention is presented.

(1) GLOSSARY

Before describing the specific details of the present invention, it is useful to provide a centralized location for various terms used herein and in the claims. A definition has been included for these various terms. However, the definition provided should not be considered limiting to the extent that the terms are known in the art. These definitions are provided to assist in the understanding of the present invention.

Doped—The term "Doped," as used herein, is a term used to indicate that a semiconductor material has been doped with a p-type or n-type material with a doping concentration range from about 2 E19 $cm^3$ to about 5 E19 $cm^3$.

Extrinsic Base-collector capacitance—The term "Extrinsic Base-collector capacitance," as used herein, indicates a capacitance created in the extrinsic layers of a semiconductor device between the extrinsic base layer and the extrinsic sub-collector layer. The extrinsic base layer and the extrinsic sub-collector layer act as the plates of the extrinsic base-collector capacitor where electric charges are stored, and the extrinsic collector layer, sandwiched in between the extrinsic base layer and the extrinsic sub-collector layer, acts as a dielectric separating the extrinsic base layer and the extrinsic sub-collector layer.

HBT—An acronym for "Heterojunction Bipolar Transistors."

Highly-Doped—The term "Highly-doped," as used herein, is a term used to indicate that a semiconductor material has been doped with a high concentration of a p-type or n-type material in a doping range from about 1 E19 $cm^{-3}$ to about 2 E20 $cm^{-3}$.

Intrinsic Base-collector capacitance—The term "Intrinsic Base-collector capacitance," as used herein, indicates a capacitance created in the intrinsic layers of a semiconductor device between the intrinsic base layer and the intrinsic sub-collector layer. The intrinsic base layer and the intrinsic sub-collector layer act as the plates of the intrinsic base-collector capacitor where electric charges are stored at, and the intrinsic collector layer, sandwiched in between the intrinsic base layer and the intrinsic sub-collector layer, acts as a dielectric separating the intrinsic base layer and the intrinsic sub-collector layer.

MBE—An acronym for "Molecular Beam Epitaxial." The term "MBE machine," as used herein, indicates a type of epitaxial semiconductor growth machine containing an arsenide/nitride dual-chamber that is used to fabricate epitaxial films and related device structures.

MOCVD—An acronym for "Metal-Organic Chemical Vapor Deposition." The term "MOCVD machine," as used herein, indicates a type of epitaxial semiconductor growth machine used to fabricate epitaxial films and related device structures.

User—The term "user," as used herein, is a standard term used to denote a person or a machine for fabricating semiconductor devices that utilizes the method for fabricating heterojunction bipolar transistors that exhibit simultaneous low base resistance and short base transit times.

VLSI—An acronym for "Very Large Scale Integrated." The term "VLSI design," as used herein, is a standard term used to identify the design of micro-electronic chips, wherein each micro-electronic chip contains over 100,000 transistors.

(2) OVERVIEW

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

Some portions of the detailed description are presented in terms of a sequence of events and symbolic representations of operations. These sequential descriptions and symbolic representations are the means used by artisans to most effectively convey the substance of their work to other artisans. The sequential acts are generally those requiring physical manipulations of physical quantities. Usually, though not necessarily, these physical quantities take the form of semiconductor materials capable of being doped to a p-type or a n-type composition, deposited, masked, etched, patterned, grown, and otherwise manipulated. It has proven convenient at times, principally for reasons of common usage, to refer to these quantities by terms such as substrates, wafers, layers, elements, contacts, and coefficients.

It is to be understood, that all of these, and similar terms, are to be associated with the appropriate physical quantities, and are merely convenient labels applied to these quantities. Unless specifically stated otherwise as apparent from the following discussions, it is appreciated that throughout the present disclosure, discussions utilizing terms such as "doping," "etching," "depositing," "masking," "patterning," "growing," "processing," "calculating," or "determining" refer to the action and processes of a semiconductor growth machine, or a computer system that manipulates and transforms semiconductor materials into specialized semiconductor devices. Furthermore, the processes presented herein are not inherently related to any particular semiconductor growth machine, processor, processor component, computer, software, or other apparatus.

The present invention, in one embodiment, provides a method for fabricating semiconductor devices, specifically heterojunction bipolar transistors that exhibit simultaneous low base resistance and short base transit times. The method includes a procedure for fabricating a semiconductor device having an extrinsic portion and an intrinsic portion, where at least one layer of the intrinsic portion has a corresponding layer in the extrinsic portion. In this fabricating procedure, a semiconductor device is built by using a starting semi-insulating substrate on which a highly-doped layer is grown, along with a set of intrinsic layers of the device (or active semiconductor layers) by combining insitu etching and epitaxial regrowth techniques. An extrinsic portion of a sub-collector layer formed on a portion of the starting semi-insulating substrate, along with a portion of the highly-doped (base) layer serve as the contact layers in the extrinsic device. As a result, this embodiment enables the fabrication of a semiconductor device having an intrinsic portion and an extrinsic portion, where a layer (typically the base) of the intrinsic portion can be deposited with a thickness different than that of a corresponding layer in the extrinsic portion.

Therefore, the present invention permits for the fabrication of a base layer in the intrinsic device independently from that of the extrinsic base contact layer. Since the thickness of the intrinsic base layer is inversely proportional to the switching speed of a semiconductor device, the thickness of the intrinsic base layer is scaled down in order to make the semiconductor device faster. Furthermore, since the thickness of the extrinsic base layer is inversely proportional to the base contact resistance in the extrinsic device, the thickness of the extrinsic base layer may be increased in order to reduce the base contact resistance and to decrease the power absorbed by the semiconductor device. Thus, the present invention allows for the fabrication of semiconductor devices that exhibit simultaneous low base resistance (thick extrinsic base layer) and short base transit times (thin intrinsic base layer), which result in semiconductor devices with fast switching times and low power consumption.

In the discussion section, below, a detailed description of an embodiment of the invention is provided. The discussion is directed principally to the operations of a method of fabricating devices according to the invention. This discussion should assist in enabling the reader in also understanding various aspects of devices produced according to the invention.

(3) DISCUSSION

Figure 1:
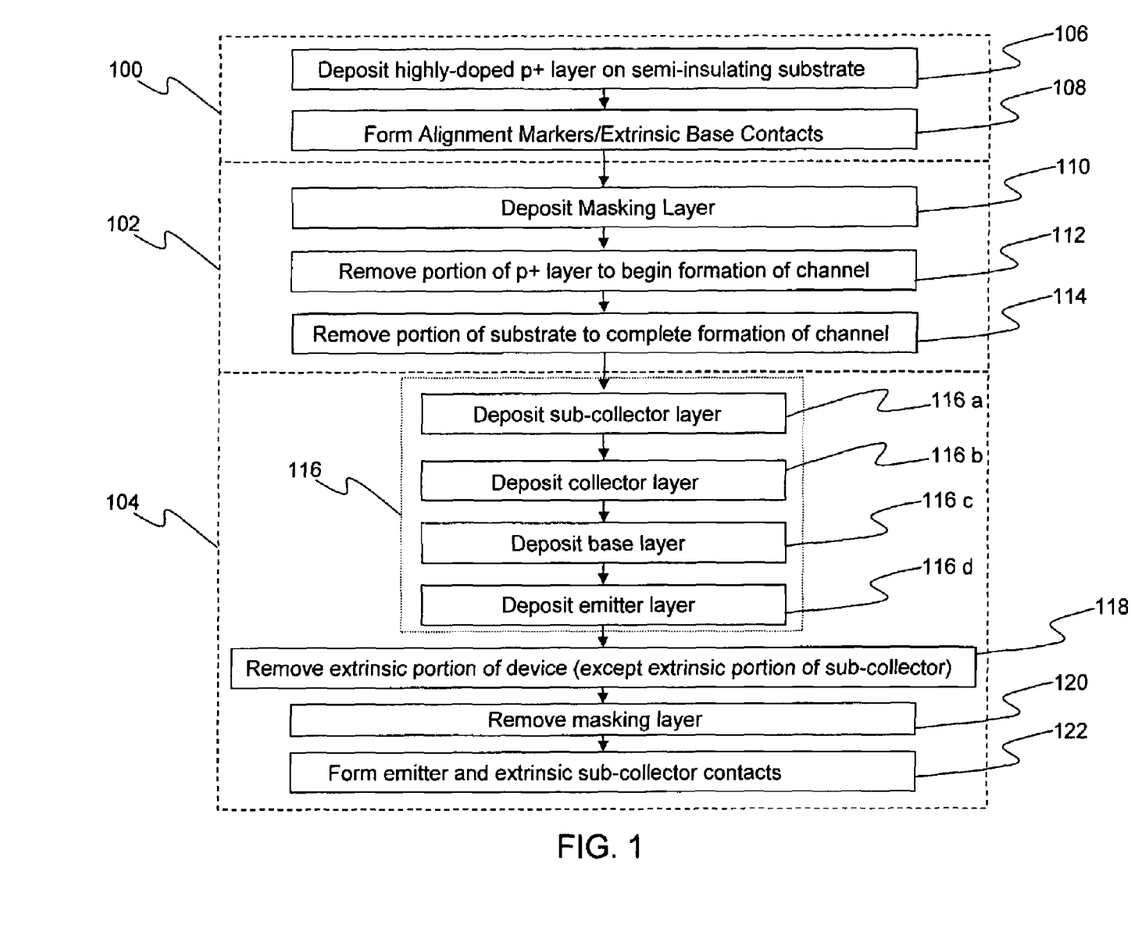
FIG. 1 is a flow chart depicting operations performed according to the present invention.

A set of operations performed in a method according to the present invention is depicted in the flowchart of FIG. 1. The operations of the method can generally be divided into three major processes. First, a set of extrinsic layers is deposited on a semi-insulating substrate 100. The extrinsic layer deposited is typically a highly p-doped layer that serves as a base layer in the extrinsic device. Next, a portion of the extrinsic layers and the substrate are removed to create a recess (well) 102. The recess includes an intrinsic portion and an extrinsic portion, with the intrinsic portion configured for the formation of a layered intrinsic semiconductor device. Finally, the layered intrinsic semiconductor device is formed in the intrinsic portion of the recess 104, with a layer of the intrinsic semiconductor device corresponding to a layer of the set of extrinsic layers.

With further reference to FIG. 1, a more detailed description of the operations involved these processes, along with additional operations typically performed in the method, is provided next. In addition to the flowchart, corresponding illustrations are presented in FIG. 2 for further clarity, the corresponding illustrations depicting a device after the execution of the corresponding operation(s). In the discussion that follows, it is noteworthy that references to the flowchart of FIG. 1 are indexed in a series starting with the numeral 100, and references to the illustrations presented in FIG. 2 are indexed in a series starting with the numeral 200. The last two digits in each numeral in each series are intended to provide clear coordination between the description of each operation in FIG. 1 and its result during the formation of a device as shown in FIG. 2.

Figure 2A:
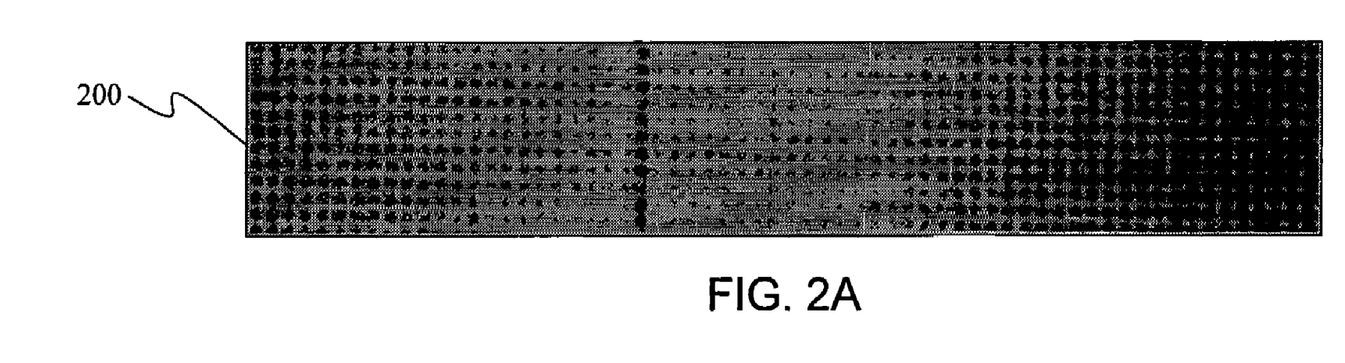
FIGS. 2A-G are cross-sectional diagrams illustrating the formation of a device according to the present invention at various stages during the operations shown in FIG. 1.

As depicted in FIG. 2A, the method begins with the provision of a semi-insulating substrate 200. The semi-insulating substrate may be formed of any suitable material, non-limiting and typical examples of which include InP, GaAs, and InAs, as will be appreciated by one of skill in the art.

Figure 2B:
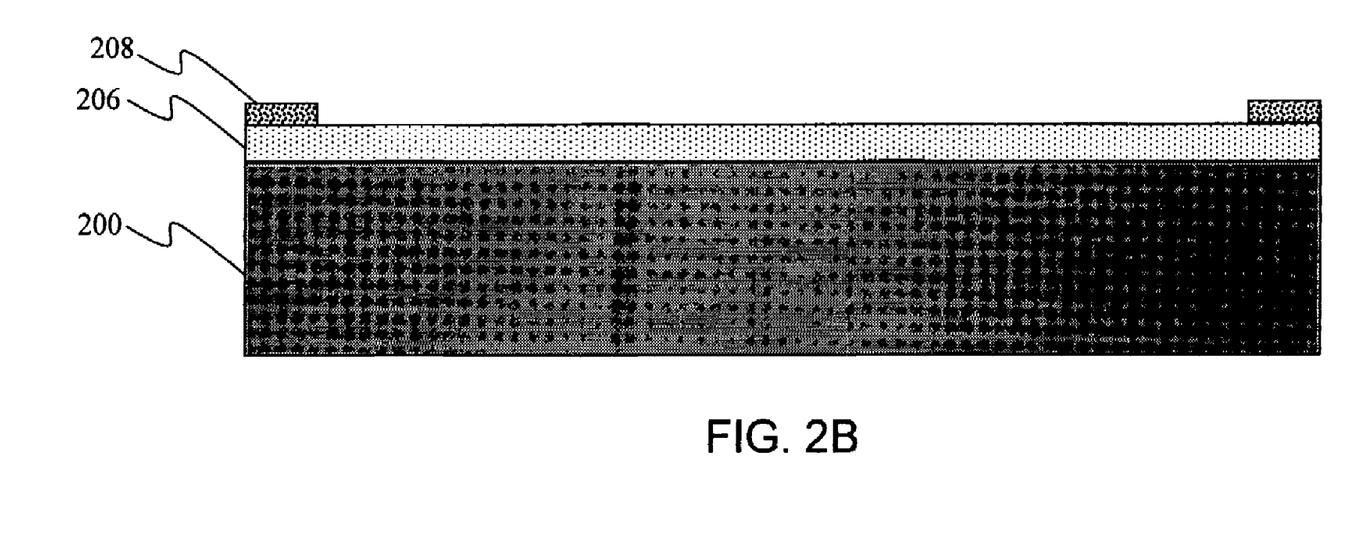

In the operation of depositing the set of extrinsic layers 100, first a highly-doped p+ layer is deposited 106 on the substrate. The highly-doped p+ layer may be formed of any suitable material that is lattice-matched with the substrate, non-limiting examples of which include InGaAs and GaAsSb. As with the other layers discussed herein, the highly-doped p+ layer may be formed of any suitable material, as will be appreciated by one of ordinary skill in the art. After the highly-doped p+ layer has been deposited as an extrinsic layer, metal alignment markers, which serve as ohmic contacts, are formed using patterning techniques on the highly-doped p+ layer in an operation of forming metal alignment markers 108. The result of the operations of depositing the highly-doped p+ layer 106 and forming the metal alignment markers 108 is shown in FIG. 2B, where the highly-doped p+ layer is indicated by reference numeral 206 and the metal alignment markers are indicated by reference numeral 208. Those of skill in the art will recognize that the metal alignment markers 108 may serve as a set of ohmic contacts, or the metal alignment markers 108 and the ohmic contacts may be formed separately, depending on the needs of a particular embodiment.

The highly-doped p+ layer is deposited with a thickness selected to minimize the resistance of the metal alignment markers. Also, since the thickness of the highly-doped p+ layer is inversely proportional to the resistance of the contacts to the highly-doped p+ layer (the extrinsic base layer contacts in the completed device), the present invention permits a reduction in the resistance present in the contacts to the highly-doped p+ layer. This is achieved by selecting a thickness for the highly-doped p+ layer that is larger than a corresponding thickness of an intrinsic p+ layer (the intrinsic base layer). By reducing this resistance, the power absorbed by the completed device during operation is reduced. In the resulting device, the ability to independently select the thicknesses of the intrinsic base layer and the extrinsic base layer permits fabrication of devices that exhibit simultaneous fast switching times and low power consumption.

Figure 2C:
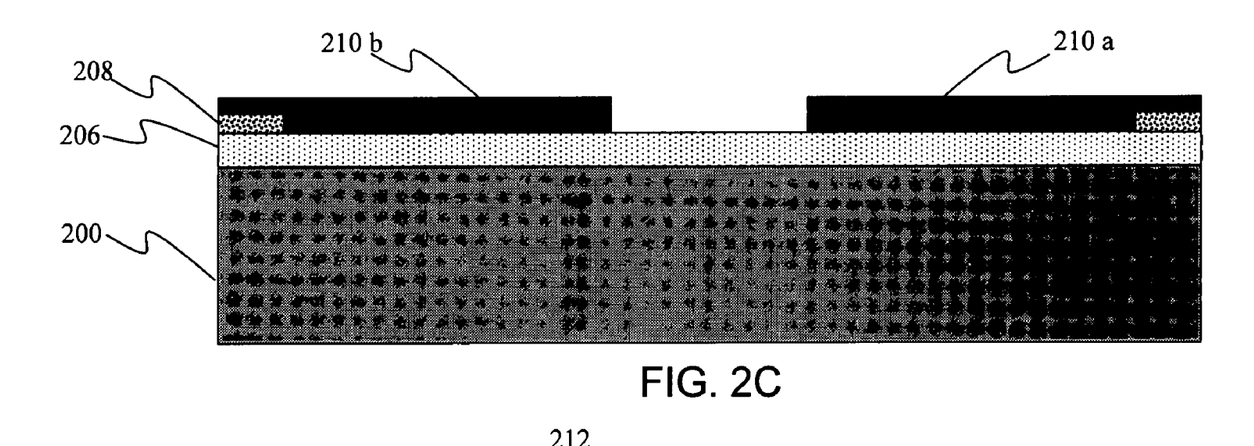

After the formation of the metal alignment markers 108 is completed, the process of creating the recess 102 is begun. In creating the recess, a masking layer is patterned 110 on the highly-doped p+ layer, leaving exposed an area of the highly-doped p+ layer corresponding to a recess area. The masking layer is typically deposited globally on a semiconductor wafer on which a device is fabricated, and may be formed of any suitable material, examples of which include SiN and SiO. The result of this operation is illustrated in FIG. 2C, where the masking layer is indicated by reference numeral 210a and the exposed area is indicated by reference numeral 210b. For further clarity, a top-view of a completed device according to the present invention is presented in FIG. 3A. The views presented in FIG. 2 are slices taken along line AA, and the recess includes an intrinsic area under the intrinsic device 300 and an extrinsic area extending from the intrinsic device 300 along line BB in which an extrinsic portion of a sub-collector layer 302 is formed. The completed device depicted in FIG. 3 will be described in greater detail further below.

Figure 2D:
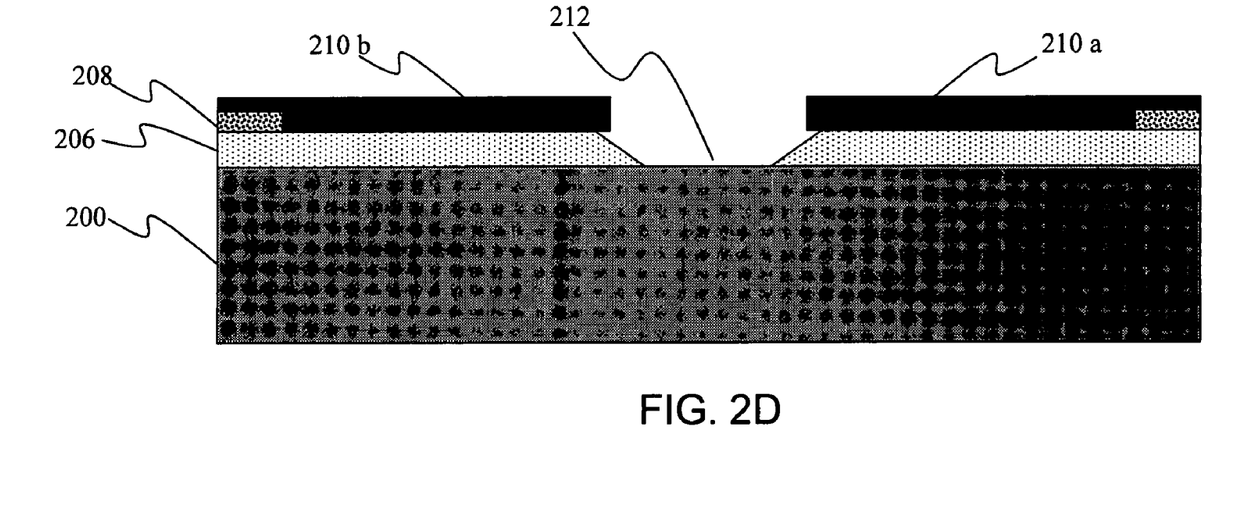

Once the masking layer has been patterned 110, an operation of removing a portion of the set of extrinsic layers 112 is performed by insitu etching using an etching solution that removes an area of the highly-doped p+ layer. In the example shown in FIG. 2C, this operation begins forming the recess, with the etching process stops at the semi-insulating substrate. In FIG. 2D, this partially-completed recess is indicated by reference numeral 212.

Figure 2E:
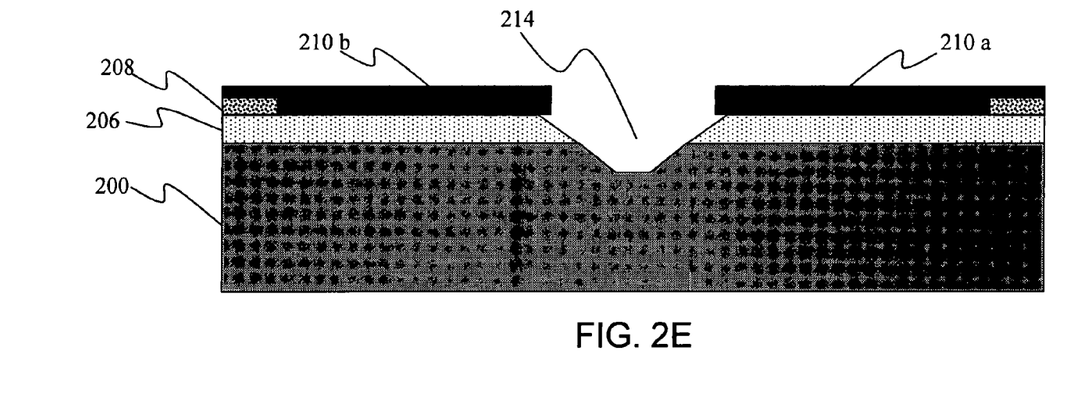
Figure 2F:
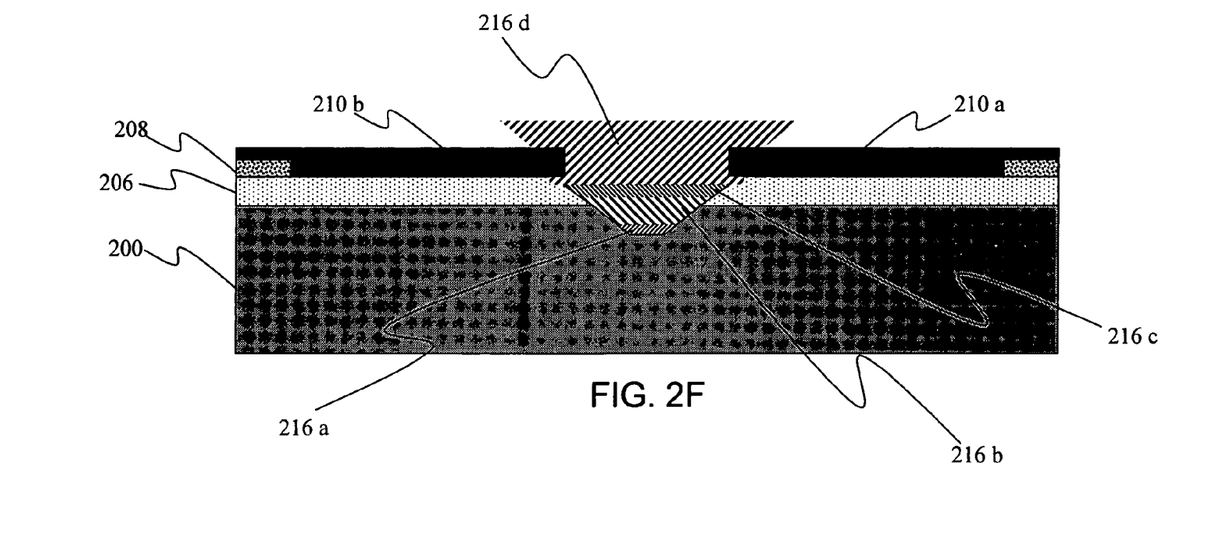

Continuing the etching process, an operation of removing a portion of the semi-insulating substrate 114 is performed next, in which an area of the semi-insulating substrate is removed by insitu etching through the masking opening in the masking layer. This operation completes the formation of the recess. In FIG. 2E, the completed recess is indicated by reference number 214.

As just discussed, the highly-doped p+ extrinsic layer and the semi-insulating substrate are both removed by using insitu etching procedures. During the insitu etching procedure, the device (with the highly-doped p+ extrinsic layer and the masking layer) is loaded into an epitaxial chamber, such as a Metal-Organic Chemical Vapor Deposition (MOCVD) machine or a Molecular Beam Epitaxial (MBE) machine, where a precursor is used to etch the recess into the semi-insulating substrate. Generally, a precursor is selected from a group consisting of HCl, methylchloride, $BCl_3$, and $CCl_4$. However, other precursor agents may be used to etch the highly-doped p+ extrinsic layer and the semi-insulating substrate, as will be appreciated by anyone skilled in the art.

By creating the recess by insitu etching, the emitter resistance is reduced by the presence of the vertically, outwardly tapering walls of the recess (as shown in FIG. 2E) that are a direct result of the insitu etching process. The vertically, outwardly tapering walls reduce the resistance of the emitter layer subsequently grown during the operation of depositing a set of device layers 116.

An area of the masking opening of the masking layer is typically selected to be wl where w denotes a length of a shorter side of the masking opening of the masking layer and l denotes a length of a longer side of the masking opening of the masking layer, where the size of w is approximately from about 0.25 µm to about 1.0 µm, and the size of l is approximately from about 1.0 µm to about 5.0 µm. In general, the masking opening of a masking layer may be of any shape. Thus, a non-limiting example of the shape of the masking opening of a masking layer may be a rectangle where "l" denotes the longest side of the rectangle, and the shorter side of the rectangle is denoted by "w."

With the recess completed, the operations in the process of forming the layered semiconductor device 104 are performed next. First, in an operation of depositing a set of device layers 116, a sub-collector layer, a collector layer, a base layer, and an emitter layer are deposited. After the device layers have been deposited 116, portions of the layers are removed to form the intrinsic device 118. Specifically, portions of the of the emitter layer, the base layer, and the collector layer corresponding to extrinsic areas are removed, leaving only the portions that form the intrinsic device. This removal process, however, leaves the sub-collector layer in tact in the recess, as will be more clearly depicted in the description of the completed device shown in FIG. 3. The acts of depositing the sub-collector layer, collector layer, base layer, and emitter layer are represented by reference numerals 116a, 116b, 116c, and 116d, respectively in FIG. 1; with the resulting respective device components represented by reference numerals 216a, 216b, 216c, and 216d, respectively in FIG. 2F.

The deposition of the device layers 116 is typically performed in an epitaxial chamber such as a Metal-Organic Chemical Vapor Deposition (MOCVD) machine or a Molecular Beam Epitaxial (MBE) machine. However, as known by one skilled in the art, many other epitaxial chambers may be used to grow the device layers. After the deposition is complete, the device is removed from the epitaxial chamber for further processing.

Non-limiting examples of the device layers are as follows: a sub-collector layer 216a of InP with a thickness of about 100 nm to about 400 nm, n+ doped in a range of about 1 µl 9 $cm^{-3}$ or higher, and desirably doped at 2 E19 $cm^{-3}$; a collector layer 216b of InP n+ doped in a range from about 1 E16 $cm^{-3}$ to 4 E16 $cm^{-3}$ with a thickness from about 150 nm to about 300 nm; a base layer 216c p+ doped in a range from about 1 E19 $cm^{-3}$ to about 1 E20 $cm^{-3}$ having a thickness from about 15 nm to about 30 nm; an emitter layer 216d formed of a material such as InP and InAlAs and n+ doped in a range from about 1 E17 $cm^{-3}$ to about 1 E18 $cm^{-3}$ with a thickness from about 50 nm to about 150 nm. Also note that an etch-stop layer, for example InGaAs may be incorporated between the collector layer 116b and the sub-collector layer 116a, with a thickness from about 1 nm to about 15 nm and n+ doped to about 2 E19 $cm^{-3}$. Additionally, a set of highly n+ doped layers formed of materials such as InP, InGaAs, and InAs may be laid on the emitter layer.

Figure 2G:
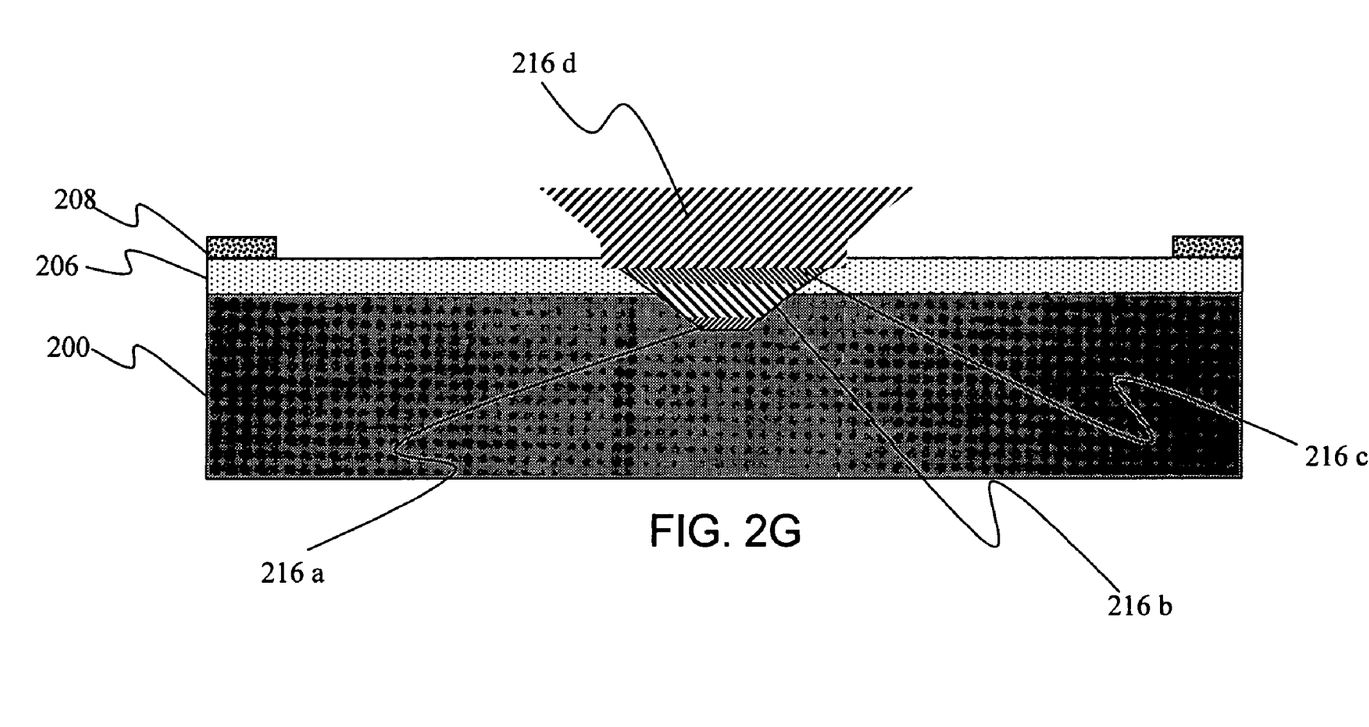

After portions of the layers have been removed to form the intrinsic device 118, an operation of removing the masking layer 120 is performed, with the result depicted in FIG. 2G.

To complete the device, contacts are formed on the extrinsic portion of the sub-collector layer and on the emitter layer 122. The completed device is depicted in FIG. 3, and is described below.

The contacts formed on the extrinsic portion of the sub-collector layer are placed in a manner (sufficiently distant from the intrinsic portion of the recess) that minimizes an intrinsic base-collector capacitance within the intrinsic device. The intrinsic base-collector capacitance is a capacitance created in the intrinsic layers of a semiconductor device between the intrinsic base layer and the intrinsic portion of the sub-collector layer, where the intrinsic base layer and the intrinsic portion of the sub-collector layer acts as plates of a capacitor (where electric charges are stored) and the intrinsic collector layer (between the intrinsic base layer and the intrinsic portion of the sub-collector layer) acts as a dielectric separating the intrinsic base layer and the intrinsic portion of the sub-collector layer. This capacitance hinders the performance of the semiconductor device by forcing the intrinsic device to fully charge or discharge the capacitance before being able to turn the intrinsic device on/off, thus slowing down the response time of the semiconductor device. The larger this capacitance becomes, the slower the response time of the semiconductor device. Therefore, since the capacitance increases when the extrinsic collector contacts (formed on the extrinsic portion of the sub-collector) are in close proximity with the intrinsic base, the invention minimizes this intrinsic base-collector capacitance by placing the contacts to the extrinsic portion of the sub-collector in an area where the intrinsic base layer is sufficiently distant with respect to the extrinsic portion of the sub-collector layer. The ability to minimize this capacitance is one aspect that sets the present invention apart from the prior art techniques, which produce devices that inherently suffer in performance from this type of capacitance.

One of skill in the art will appreciate that the actual method used for the production of a particular device may include a subset or superset of the operations just described. In particular, some of the operations may be omitted or modified to tailor the device for a particular application.

Figure 3A:
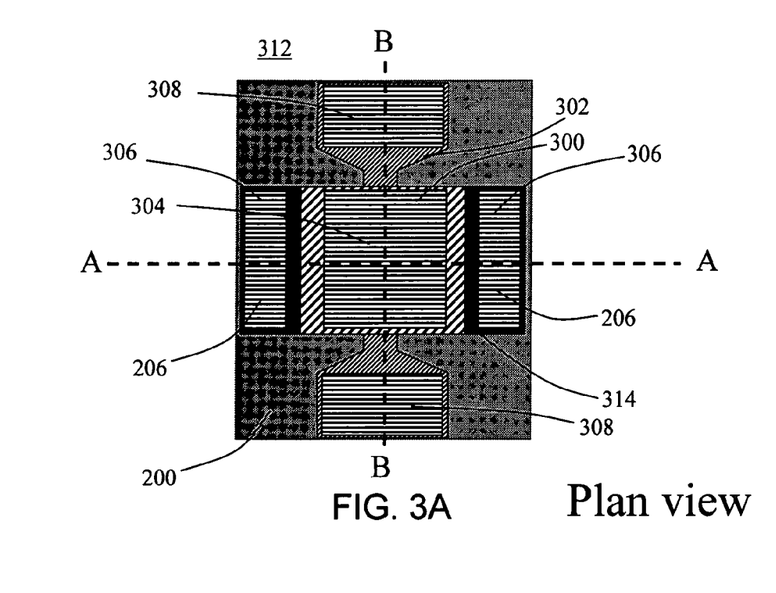
FIG. 3A is a top-view illustration of a completed device fabricated according to the operations depicted in FIG. 1.
Figure 3B:
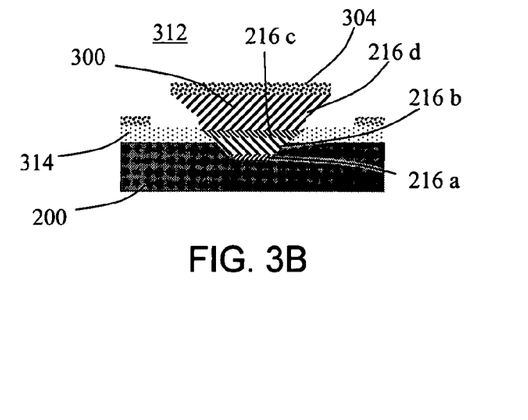
FIG. 3B is a side-view illustration of a completed device fabricated according to the operations depicted in FIG. 1.
Figure 3C:
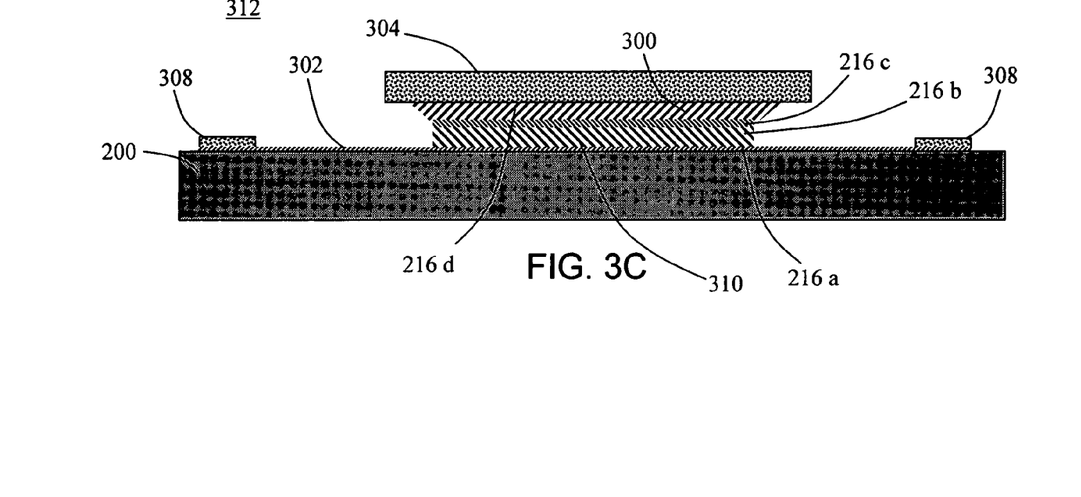
FIG. 3C is another side-view illustration of a completed device fabricated according to the operations depicted in FIG. 1.

FIG. 3 is an illustration of a completed device according to the present invention, where FIG. 3A presents a top-view of the device, FIG. 3B presents a side view taken along cut AA, and FIG. 3C presents a side view taken along cut BB. The view shown in FIG. 3B is along the same cut as the views shown in FIG. 2.

As previously described, and as shown in FIG. 3A, the device of the present invention is formed on a substrate 200. In particular, the device shown is a heterojunction bipolar transistor having a set of contacts including an emitter layer contact 304, a pair of extrinsic base layer contacts 306, and a pair of extrinsic sub-collector layer contacts 308. Although not to scale, as can be seen in the FIGS. 3B and 3C, the actual formation of the intrinsic device 300 results in a geometry that is typically larger at the top than at the bottom. After removing the extrinsic portion of the collector layer 216b, the base layer 216c, and the emitter layer 216d, only intrinsic portions of these layers remain, confined to the area of the intrinsic device 300. On the other hand, the sub-collector layer 216a is formed with an extrinsic portion 302 and an intrinsic portion 310. The intrinsic portion 310 of the sub-collector layer 216a is defined as the portion proximate (under) the intrinsic device 300, whereas the extrinsic portion 302 is defined as the remainder. The sub-collector layer 216a extends over the area of the recess, and the recess is designed to optimize the placement of the extrinsic sub-collector layer contacts 308. In the completed device 312, the remaining portion of the highly-doped p+ layer serves as the extrinsic base layer 314 on which the extrinsic base layer contacts 306 are formed.

An important aspect of the invention is that the intrinsic base layer 216c has a thickness that may be determined independently of the thickness of the extrinsic base layer 314. This feature permits the design of devices that simultaneously possess low base resistance and short base transit time.

In productions runs for fabricating devices according to the invention, a set of semiconductor devices is fabricated on a single wafer, with each individual semiconductor device comprising its own intrinsic and extrinsic portions. In the set of semiconductor devices, the intrinsic base sub-collector capacitance of a device increases when the intrinsic base of the device is in close proximity with contacts on the extrinsic portion of the sub-collector of another device. As previously stated, as this capacitance is increased, the response time that it takes for the device to switch "on" or "off" is increased by the extra time that it takes the device to charge or discharge this capacitor before being able to turn the device "on" or "off." Therefore, in order to minimize the impact of the capacitance created by the proximity of the intrinsic base of a device with the extrinsic collector contacts of another device, a particular semiconductor device must be separated from the other semiconductor devices on the wafer by placing the extrinsic contacts to the sub-collector of a particular device in an area sufficiently distant with respect to the intrinsic base layers of any other semiconductor devices within the wafer.

(4) ADVANTAGES OF THE INVENTION

Above, a method for the fabrication of heterojunction bipolar transistors that exhibit simultaneous short base transit times and low base resistance-yielding devices with fast switching times and low power consumption was presented. The present invention enables a "user" utilizing the method of the present invention to select a thickness of an intrinsic layer of a semiconductor device independently from a thickness of a corresponding extrinsic layer. The semiconductor device being built will simultaneously exhibit fast switching times and low power consumption as a result of simultaneously having a "thin intrinsic base layer," which yields short base transit times, and a "thick extrinsic base layer," which yields a low base resistance.

Devices fabricated according to the present invention possess many further advantages, including: the ability to independently select a thickness of an intrinsic layer of the semiconductor device being built, from a thickness of a corresponding extrinsic layer, thus fabricating a semiconductor device that simultaneously exhibits fast switching times and low power consumption; minimizing or eliminating an extrinsic base-collector capacitance, thus saving time and power by not having to charge/discharge an extrinsic base-collector capacitance; reducing the resistance of the emitter layer by growing vertically, outwardly tapering walls in the recess (well) where the intrinsic device is grown; and reducing the resistance present in the contacts to the emitter layer by placing a set of highly n-doped intrinsic layers on the emitter layer opposite the intrinsic base layer. Furthermore, the present invention does not require that all the advantageous features and all the advantages need to be incorporated into every embodiment of the invention.

Although the present invention has been described in considerable detail with reference to certain embodiments thereof, other embodiments are possible. For example, other different configurations of semiconductor devices (other than HBTs) may be implemented using the present invention; the method may fabricate an HBT with a "pnp" configuration instead of a HBT with a "npn" configuration, such as the one specifically described above; different semiconductor materials may be used for the semi-insulating substrate layer, the base layer, and the masking layer, other than the non-limiting examples cited with regard to the various embodiments above; and different etching precursors may be used to etch a well into the semi-insulating substrate other than HCl, methylchloride, $BCl_3$, and $CCl_4$. Therefore, the spirit and scope of the appended claims should not be limited to the description of the embodiments contained herein.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" in the claims herein is not intended to invoke the provisions of 35 U.S.C. Section 112, Paragraph 6.

What is claimed is:

1. A method for fabricating semiconductor devices, the method comprising acts of:
   depositing a set of extrinsic layers on a substrate;
   removing a portion of the extrinsic layers and substrate to create a well having an intrinsic portion and an extrinsic portion, where the intrinsic portion is configured for receiving a layered intrinsic semiconductor device; and forming a layered intrinsic semiconductor device in the intrinsic portion of the well, wherein the layered intrinsic semiconductor device includes a type of layer selected from a group comprising an intrinsic collector layer, an intrinsic base layer, and an intrinsic sub-collector layer, and where the extrinsic layers include a type of layer selected from a group comprising an extrinsic collector layer, an extrinsic base layer, and an extrinsic sub-collector layer, such that a type of layer of the intrinsic semiconductor device is connected to a same type of layer of the extrinsic layers.

2. A method for fabricating semiconductor devices as set forth in claim 1, wherein in the act of depositing a set of extrinsic layers, a highly-doped p+ extrinsic layer is deposited, and where in the act of removing a portion of the extrinsic layers, a portion of the highly-doped p+ extrinsic layer and a portion of the substrate are removed.

3. A method for fabricating semiconductor devices as set forth in claim 2, wherein in the act of removing a portion of the highly-doped p+ extrinsic layer and a portion of the substrate, the well is formed as a recess having an extrinsic portion corresponding to the extrinsic portion of the well and an intrinsic portion corresponding to the intrinsic portion of the well, where the intrinsic portion of the recess is defined as proximate to an intersection between the highly-doped p+ extrinsic layer and the recess and where the extrinsic portion of the recess is defined as outside the intersection between the highly-doped p+ extrinsic layer and the recess, and wherein in the act of forming a layered intrinsic semiconductor device, the layered intrinsic semiconductor device is formed substantially in the intrinsic portion of the recess.

4. A method for fabricating semiconductor devices as set forth in claim 3, further comprising an act of forming a sub-collector layer in the recess, the sub-collector having an intrinsic portion proximate to the intrinsic portion of the recess and an extrinsic portion proximate to the extrinsic portion of the recess.

5. A method for fabricating semiconductor devices as set forth in claim 4, further comprising an act of forming a layered intrinsic semiconductor device in the well including acts of:

depositing a collector layer on the sub-collector layer, at least a portion of which is an intrinsic portion, and where the intrinsic portion of the collector layer is proximate to the intrinsic portion of the sub-collector layer;

depositing a base layer on the collector layer, at least a portion of which is an intrinsic portion, and where the intrinsic portion of the base layer proximate to the intrinsic portion of the collector layer, with the intrinsic portion of the base layer proximate to the highly-doped p+ extrinsic layer, where the highly-doped p+ extrinsic layer acts as an extrinsic base layer and where the intrinsic base layer has a thickness independently selectable from a thickness of the extrinsic base layer; and depositing an emitter layer on the intrinsic base layer.

6. A method for fabricating semiconductor devices as set forth in claim 5, where prior to the act of removing a portion of the highly-doped p+ extrinsic layer and a portion of the substrate, the method further comprises an act of masking the highly-doped p+ layer with a mask so that an area corresponding to the well is exposed in preparation for the act of removing a portion of the highly-doped p+ extrinsic layer and a portion of the substrate, where an opening in the mask corresponds to a placement of the well.

7. A method for fabricating semiconductor devices as set forth in claim 6, further comprising an act of forming ohmic contacts on the extrinsic portion of the sub-collector layer.

8. A method for fabricating semiconductor devices as set forth in claim 7, further comprising an act of removing the mask.

9. A method for fabricating semiconductor devices as set forth in claim 8, further comprising removing a portion of the collector layer and a portion of the base layer such that only the intrinsic portion of the collector layer and the intrinsic portion of the base layer remain, thus exposing the extrinsic portion of the sub-collector layer.

10. A method for fabricating semiconductor devices as set forth in claim 9, further comprising an act of providing a substrate formed of a semi-insulating material.

11. A method for fabricating semiconductor devices as set forth in claim 10, wherein the substrate is formed of a material selected from a group consisting of InP, GaAs, and InAs.

12. A method for fabricating semiconductor devices as set forth in claim 11, wherein the highly-doped p+ layer is formed of a material selected from a group consisting of InGaAs and GaAsSb.

13. A method for fabricating semiconductor devices as set forth in claim 12, wherein the mask is formed of a material selected from a group consisting of SiN and SiO.

14. A method for fabricating semiconductor devices as set forth in claim 13, wherein the act of removing a portion of the extrinsic layers is performed by insitu etching.

15. A method for fabricating semiconductor devices as set forth in claim 14, wherein the act of removing a portion of the extrinsic layers is performed in an epitaxial chamber.

16. A method for fabricating semiconductor devices as set forth in claim 15, wherein a precursor is used for the insitu etching, with the precursor selected from a group consisting of HCl, methylchloride, $BCl_3$, and $CCl_4$.

17. A method for fabricating semiconductor devices as set forth in claim 16, wherein in the act of forming a layered intrinsic semiconductor device in the well, the layered intrinsic semiconductor device is grown in an epitaxial chamber.

18. A method for fabricating semiconductor devices as set forth in claim 17, wherein in the act of forming a layered intrinsic semiconductor device in the well, the epitaxial chamber is selected from a group consisting of a MOCVD machine and a MBE machine.

19. A method for fabricating semiconductor devices as set forth in claim 18, wherein:

in the act of forming the sub-collector layer, the subcollector layer is formed of n+ doped InP;

in the act of depositing an intrinsic collector layer, the intrinsic collector layer is formed of InP doped in a range from about $1\ E16\ cm^{-3}$ to about $4\ E16\ cm^{-3}$ having a thickness from about 150 nm to about 300 nm;

in the act of depositing the intrinsic base layer, the intrinsic base layer is formed of a p+ doped material, doped in a range from about $1\ E19\ cm^{-3}$ to about $2\ E20\ cm^{-3}$ having a thickness from about 15 nm to about 30 nm; and in the act of depositing the emitter layer, the emitter layer is formed of a material selected from a group consisting of InP and InAlAs doped in a range from about $1\ E17\ cm^{-3}$ to about $1\ E18\ cm^{-3}$ having a thickness from about 50 nm to about 150 nm.

20. A method for fabricating semiconductor devices as set forth in claim 19, further comprising an act of depositing an intrinsic etch stop layer of InGaAs having a thickness from about 1 nm to about 10 nm, wherein the intrinsic etch stop layer is formed between the intrinsic collector layer and the sub-collector layer.

* * * * *